(12) United States Patent
Lai et al.

(10) Patent No.: US 9,689,623 B2
(45) Date of Patent: Jun. 27, 2017

(54) COMPOSITE STRUCTURE OF FLAT HEAT PIPE AND HEAT CONDUCTION DEVICE THEREOF

(71) Applicant: CHAUN-CHOUNG TECHNOLOGY CORP., New Taipei (TW)

(72) Inventors: Kuan-Ming Lai, New Taipei (TW); Cheng-Tu Wang, New Taipei (TW)

(73) Assignee: CHAUN-CHOUNG TECHNOLOGY CORP., New Taipei (TW)

( * ) Notice: Subject to any disclaimer, the term of this patent is extended or adjusted under 35 U.S.C. 154(b) by 109 days.

(21) Appl. No.: 14/932,978

(22) Filed: Nov. 5, 2015

(65) Prior Publication Data

US 2017/0131036 A1 May 11, 2017

(51) Int. Cl.
| | | |
|---|---|---|
| *H01L 23/473* | (2006.01) | |
| *F28D 15/02* | (2006.01) | |
| *F28D 15/04* | (2006.01) | |

(52) U.S. Cl.
CPC ............ *F28D 15/02* (2013.01); *F28D 15/04* (2013.01); *H01L 23/473* (2013.01)

(58) Field of Classification Search
CPC .. F28D 15/02; F28D 2015/0216; F28D 15/04; F28D 15/046; F28D 15/0266; F28D 15/0233; B23P 2700/09; H01L 23/427
USPC ...... 165/104.21, 104.26, 104.33; 29/890.032
See application file for complete search history.

(56) References Cited

U.S. PATENT DOCUMENTS

| | | | | |
|---|---|---|---|---|
| 2005/0103480 | A1* | 5/2005 | Pokharna | H01L 23/427 165/122 |
| 2007/0022603 | A1* | 2/2007 | Chuang | B23P 15/26 29/890.032 |
| 2007/0107875 | A1* | 5/2007 | Lee | H01L 23/427 165/104.26 |
| 2007/0284096 | A1* | 12/2007 | Tien | F28D 15/0266 165/178 |
| 2008/0156464 | A1* | 7/2008 | Tsou | F28D 15/0233 165/104.33 |
| 2008/0158817 | A1* | 7/2008 | Tsunoda | G06F 1/203 361/697 |
| 2012/0211202 | A1* | 8/2012 | Wu | F28D 15/0233 165/104.26 |
| 2012/0307452 | A1* | 12/2012 | Yan | G06F 1/20 361/700 |
| 2013/0168054 | A1* | 7/2013 | Yang | F28D 15/0233 165/104.26 |

(Continued)

*Primary Examiner* — Etsub Berhanu
*Assistant Examiner* — Jose O Class-Quinones
(74) *Attorney, Agent, or Firm* — Chun-Ming Shih; HDLS IPR Services

(57) ABSTRACT

A flat heat pipe includes a tube, a sealed section, an insulation section and a heat conduction section. The tube includes a metal shell and a chamber. The sealed section is formed by rolling the metal shell and making two opposite inner walls of the tube combined closely on the tube that separate the chamber into a first chamber and a second chamber. The insulation section is a hollow chamber including the first chamber. The conduction section includes the second chamber, a capillary and working fluid. Further, the heat conduction device includes a heat dissipating shell, a heating element and a flat heat pipe. The plate heat pipe is disposed in the heat dissipating shell and thermally conducted with the heating element.

10 Claims, 2 Drawing Sheets

(56) References Cited

U.S. PATENT DOCUMENTS

2013/0312938 A1\* 11/2013 Cheng .................... F28D 15/04
165/104.26

\* cited by examiner

COMPOSITE STRUCTURE OF FLAT HEAT PIPE AND HEAT CONDUCTION DEVICE THEREOF

BACKGROUND OF THE INVENTION

Field of the Invention

The present invention generally relates to a heat pipe and, in particular to structures of a flat heat pipe.

Description of Prior Art

As heat pipes have characteristics of high heat transfer capability, light weight and simple structures for transferring a lot of heat without power consumption. Now heat pipes are widely applied in heat conduction of handheld communication devices for rapidly transferring heat of heating components. Furthermore, flat heat pipes occupy less space that are more suitable for applying in thin electronic products.

Generally speaking, one end of a flat heat pipe is an evaporator portion, and the other end is a condenser portion. Besides, the evaporator portion is attached on the heating electronic components, and the working fluid inside the evaporator portion will be vaporized rapidly and flew to the condenser portion at a low temperature for releasing heat through heat dissipating elements (ex. shell or fins) after being heated. However, when flat heat pipes are used in thin hand held electronic devices (ex. mobile phones or tablet PCs), the evaporator portion will be closed to the shell surface when the flat heat pipe is used to transfer the heat of heating electronic components. In this situation, users would be likely to be injured when touching the high temperature shell.

In view of the above drawbacks, the Inventor proposes the present invention based on his expert knowledge and elaborate researches in order to solve the problems of prior art.

SUMMARY OF THE INVENTION

Accordingly, an object of the present invention is to provide composite structure of a flat heat pipe and a heat conduction device, in which heat generated from a heating element will not accumulate on the heat dissipating shell that can prevent users from touching the high temperature shell.

In order to achieve the object mentioned above, the present invention provides composite structures of a flat heat pipe comprising a tube, a sealed section, an insulation section and a heat conduction section. The tube has a metal shell and a chamber surrounded by the metal shell. The sealed section is formed by rolling the metal shell and making two opposite inner walls of the tube combined closely on the tube, and the sealed section separates the chamber into a first chamber and a second chamber. The insulation section is located in one side of the sealed section of the tube, and the insulation section is a hollow chamber including the first chamber. The heat conduction section is located in another side of the sealed section of the tube, and the heat conduction section includes the second chamber, a capillary structure disposed in an inner wall of the second chamber and a working fluid filled in the second chamber.

In order to achieve the object mentioned above, the present invention provides a heat conduction device comprising a heat dissipating shell, a heating element and a flat heat pipe. The heat dissipating shell has an installation space, and the heating element is disposed in the installation space. The flat heat pipe is disposed in the installation space and thermally conducted with the heating element. The flat heat pipe comprises a tube, a sealed section, an insulation section and a heat conduction section. The tube has a metal shell and a chamber surrounded by the metal shell. The sealed section is formed by rolling the metal shell and making two opposite inner walls of the tube combined closely on the tube, and the sealed section separates the chamber into a first chamber and a second chamber. The insulation section is located in one side of the sealed section of the tube, and the insulation section is a hollow chamber including the first chamber. The heat conduction section is located in another side of the sealed section of the tube, and the heat conduction section includes the second chamber, a capillary structure disposed in an inner wall of the second chamber and a working fluid filled in the second chamber.

Accordingly, an object of the present invention is to provide a heat conduction device, in which a part of the heating element is attached on the insulation section, and another part of the heating element is attached on the heat conduction section. With the heat conduction section (heat pipe) has a good conduction efficiency, the heat will not accumulate on the heat dissipating shell and a high temperature shell will not occur.

Comparing to the prior art, the composite structures of a flat heat pipe of the present invention comprises an insulation section and a heat conduction section, wherein the insulation section is a hollow chamber, and the heat conduction section is a heat pipe. In the present invention, the flat heat pipe is applied in a heat conducting device which one side of the insulation section is attached on the heating element. Besides, the hollow chamber has an effect of insulation, and the effect of insulation will be enhanced by evacuating or filling other materials. Thus the heat of the heating element will mostly be conducted to the heat conduction section through the tube. Therefore, the heat of the heating element will not accumulate on the other side of the insulation section (a location near the heat dissipating shell). Thereby the surface of the heat dissipating shell will not at a particular high temperature that a high temperature of the heat dissipating shell will not occur, and that can prevent users from touching a high temperature shell.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
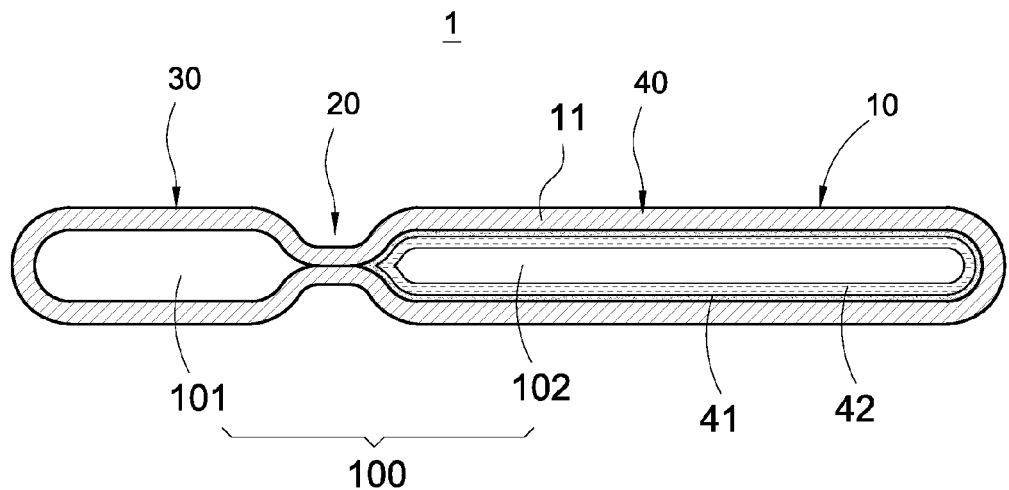
FIG. 1 is a cross sectional schematic view of composite structures of a flat heat pipe of the present invention.

Please refer to FIG. 1, which depicts a cross sectional schematic view of composite structures of a flat heat pipe of the present invention. A flat heat pipe 1 of the present invention includes a tube 10, a sealed section 20, an insulation section 30 and a heat conduction section 40. The sealed section 20, the insulation section 30 and the heat conduction section 40 are formed on the tube 10 separately and constituted the flat heat pipe 1.

The tube 10 has a metal shell 11 and a chamber 100 surrounded by the metal shell 11. Preferably, the tube 10 is a flat tube, and the metal shell 11 is a copper shell.

The sealed section 20 is formed by rolling the metal shell 11 that makes two opposite inner walls of the tube 10 combined closely on the tube 10. Thus the sealed section 20 separates the chamber 100 into a first chamber 101 and a second chamber 102.

Moreover, the insulation section 30 is located in one side of the sealed section 20 of the tube 10, and the insulation section 30 is a hollow chamber which includes the first chamber 101.

The heat conduction section 40 is located in another side of the sealed section 20 of the tube 10. The heat conduction section 40 includes the second chamber 102, a capillary structure 41 disposed in an inner wall of the second chamber 102 and a working fluid 42 filled in the second chamber 102. Preferably, the length of the heat conduction section 40 is longer than the insulation section 30.

In an embodiment of the present invention, the flat heat pipe 1 is used in a handheld electronic device for heat dissipating. More details are described in the following.

Figure 2:
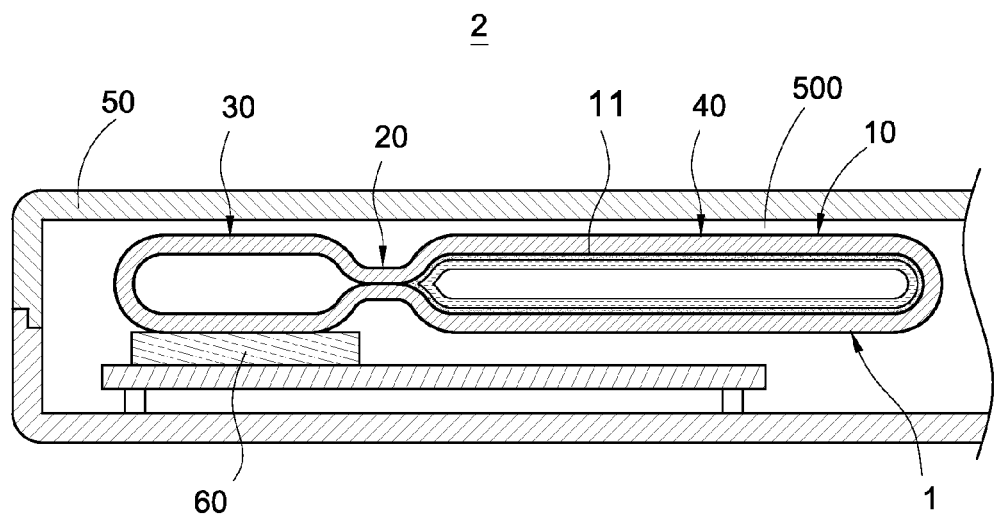
FIG. 2 is a cross sectional schematic view of a heat conduction device of the present invention.

Please further refer to FIG. 2, which depicts a cross sectional schematic view of a heat conduction device of the present invention. A heat conduction device 2 of the present invention includes a flat heat pipe 1, a heat dissipating shell 50 and a heating element 60. The flat heat pipe 1 is attached on the heating element 60 for conducting the heat generated from the heating element 60. Furthermore, the heat conducted from the flat heat pipe 1 will be dissipated through the heat dissipating shell 50.

In an embodiment of the present invention, the heat dissipating shell 50 has an installation space where the heating element 60 is disposed. Besides, the flat heat pipe 1 is disposed in the installation space and thermally conducted with the heating element 60.

In the present embodiment, one side of the flat heat pipe 1 is attached on the heating element 60, and the other side of the flat heat pipe 1 faces the inner wall of the heat dissipating shell 50. Moreover, a gap 500 is reserved between the flat heat pipe 1 and the inner wall of the heat dissipating shell 50. In addition, the heating element 60 is, but not limited to, attached on the insulation section 30 of the flat heat pipe 60.

Thereby, the heat generated from the heating element 60 will be conducted to the insulation section 30, and then the heat will be conducted to the sealed section 20 and the heat conduction section 40 through the insulation section 30. At last, the heat will be dissipated to the outside through the heat dissipating shell 50 that a purpose of heat dissipating will be achieved.

It is noted that the insulation section 30 of the present invention is a hollow chamber and has an effect of insulation. Therefore, when one side of the insulation section 30 is attached on the heating element 60, the heat generated from the heating element 60 will mostly be conducted to the sealed section 20 through the tube 10, and then the heat will be conducted to the conductive section 40 through the sealed section 20. Thus the heat will be uniformly transferred to the plate heat pipe 1 instead of accumulating on the other side of the insulation section 30 (a location closed to the heat dissipating shell 50). In this way, the surface of the heat dissipating shell 50 will not at a high temperature, and a particular high temperature will not be occur on the surface of the heat dissipating shell 50.

Figure 3:
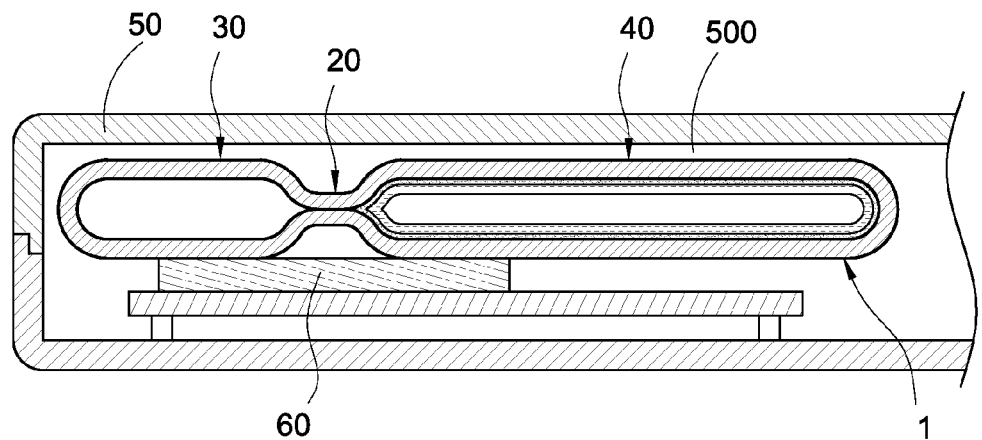
FIG. 3 is another embodiment of a heat conduction device of the present invention.

With referring to FIG. 3, which depicts another embodiment of a heat conduction device of the present invention. A heat conduction device in FIG. 3 is similar with the heat conduction device in FIG. 2, and a difference is that the heat conduction position of the flat heat pipe and the heating element 60. In the present embodiment, a part of the heating element 60 is attached on the insulation section 30, and another part of the heating element 60 is attached on the heat conduction section 40. The heat generated from the heating element 60 will mostly be conducted to the sealed section 20 through the tube 10. Because the heat conduction section 40 (heat pipe structures) has a good conduction efficiency, the heat generated from the heating element 60 and transferred through the heat conduction section 40 will improve the conduction efficiency and make the heat be uniformly transferred to the flat heat pipe. Thus the heat will not accumulate on the heat dissipating shell 50, and a high temperature on the surface of the heat dissipating shell 50 will not occur.

Figure 4:
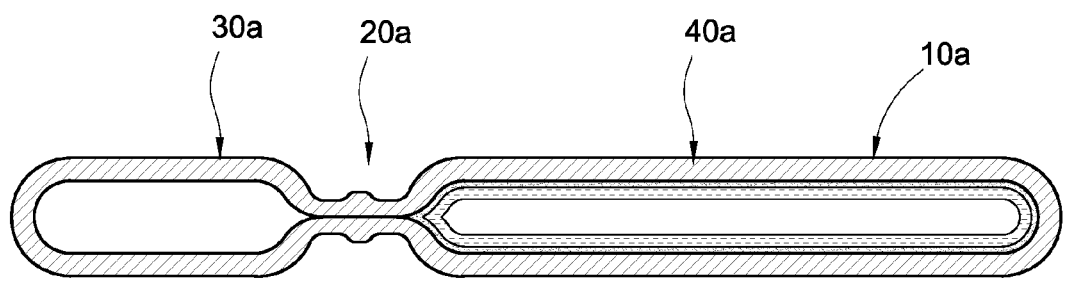
FIG. 4 is a cross sectional view of a second embodiment of the flat heat pipe of the present invention.

Please refer to FIG. 4, which depicts a cross sectional view of a second embodiment of the flat heat pipe of the present invention. Structures and using method are substantially the same as the first embodiment. A flat heat pipe 1a includes a tube 10a, a sealed section 20a, an insulation section 30a and a heat conduction section 40a. The sealed section 20a, the insulation section 30a and the heat conduction section 40a are formed separately on the tube 10a and constituted the flat heat pipe 1a. A difference of the present embodiment is that the sealed section 20a is configured in a wavy shape, wherein the wavy sealed section 20a is provided to isolate the insulation section 30a and the heat conduction section 40a completely for a better sealing effect. Thus the structures and functions of the insulation section 30a and the heat conduction section 40a can be maintained individually.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. Composite structures of a flat heat pipe, comprising:
a tube having a metal shell and a chamber surrounded by the metal shell;
a sealed section formed by rolling the metal shell and making two opposite inner walls of the tube combined closely on the tube, the sealed section separating the chamber into a first chamber and a second chamber;
an insulation section located in one side of the sealed section of the tube, wherein the insulation section is a hollow chamber including the first chamber, wherein the insulation section is evacuated to enhance an effect of insulation; and
a heat conduction section located in another side of the sealed section of the tube, the heat conduction section including the second chamber, a capillary structure disposed only in an inner wall of the second chamber and a working fluid filled only in the second chamber.

2. The structures according to claim 1, wherein the tube is a flat tube, and the metal shell is a copper shell.

3. The structures according to claim 1, wherein a length of the heat conduction section is longer than the insulation section.

4. The structures according to claim 1, wherein the sealed section is configured in a wavy shape.

5. A heat conduction device, comprising:
 a heat dissipating shell having an installation space;
 a heating element disposed in the installation space; and
 a flat heat pipe disposed in the installation space and thermally conducted with the heating element, comprising:
 a tube having a metal shell and a chamber surrounded by the metal shell;
 a sealed section formed by rolling the metal shell and making two opposite inner walls of the tube combined closely on the tube, the sealed section separating the chamber into a first chamber and a second chamber;
 an insulation section located in one side of the sealed section of the tube, wherein the insulation section is a hollow chamber including the first chamber, wherein the insulation section is evacuated to enhance an effect of insulation; and
 a heat conduction section located in another side of the sealed section of the tube, the heat conduction section including the second chamber, a capillary structure disposed only in an inner wall of the second chamber and a working fluid filled only in the second chamber.

6. The heat conduction device according to claim 5, wherein the heating element is attached on the insulation section.

7. The heat conduction device according to claim 5, wherein a part of the heating element is attached on the insulation section, and another part of the heating element is attached on the heat conduction section.

8. The heat conduction device according to claim 5, wherein one side of the flat heat pipe is attached on the heating element, and another side of the flat heat pipe faces an inner wall of the heat dissipating shell.

9. The heat conduction device according to claim 8, wherein a gap is reserved between the flat heat pipe and the inner wall of the heat dissipating shell.

10. The heat conduction device according to claim 5, wherein a length of the heat conduction section is longer than the insulation section.

\* \* \* \* \*